US010115789B2

(12) United States Patent
Wang

(10) Patent No.: US 10,115,789 B2
(45) Date of Patent: Oct. 30, 2018

(54) NONVOLATILE MEMORY CELL WITH IMPROVED ISOLATION STRUCTURES

(71) Applicant: WaferTech, LLC, Camas, WA (US)

(72) Inventor: Swen Wang, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 15/218,637

(22) Filed: Jul. 25, 2016

(65) Prior Publication Data
US 2016/0336397 A1  Nov. 17, 2016

Related U.S. Application Data

(62) Division of application No. 14/501,666, filed on Sep. 30, 2014, now Pat. No. 9,401,367.

(51) Int. Cl.
| | |
|---|---|
| H01L 21/336 | (2006.01) |
| H01L 29/06 | (2006.01) |
| H01L 27/11521 | (2017.01) |
| H01L 21/28 | (2006.01) |
| H01L 29/417 | (2006.01) |
| H01L 29/423 | (2006.01) |
| H01L 21/761 | (2006.01) |
| H01L 29/66 | (2006.01) |
| H01L 29/788 | (2006.01) |

(52) U.S. Cl.
CPC .... *H01L 29/0646* (2013.01); *H01L 21/28273* (2013.01); *H01L 21/761* (2013.01); *H01L 27/11521* (2013.01); *H01L 29/41775* (2013.01); *H01L 29/42324* (2013.01); *H01L 29/66825* (2013.01); *H01L 29/7881* (2013.01)

(58) Field of Classification Search
USPC .......................................... 438/257, 315, 201
See application file for complete search history.

(56) References Cited

U.S. PATENT DOCUMENTS

| | | | | |
|---|---|---|---|---|
| 7,553,726 | B2 * | 6/2009 | Yoon | H01L 27/115 257/E21.68 |
| 2007/0145467 | A1 * | 6/2007 | Park | H01L 27/115 257/315 |
| 2008/0002476 | A1 * | 1/2008 | Yoo | H01L 27/115 365/185.18 |
| 2011/0147819 | A1 * | 6/2011 | Shiba | G11C 16/0441 257/316 |
| 2013/0250700 | A1 * | 9/2013 | La Rosa | H01L 29/788 365/185.29 |

* cited by examiner

*Primary Examiner* — Timor Karimy
(74) *Attorney, Agent, or Firm* — Duane Morris LLP

(57) ABSTRACT

A method for forming a non-volatile memory cell is provided. The method comprises: forming a field region with a first impurity type in a semiconductor substrate, the field region having a first impurity concentration; forming a plurality of spaced apart higher concentration regions with the first impurity type within the field region, the higher concentration regions each having a higher concentration than the first impurity concentration; and forming a plurality of floating gate transistors in the field region between the higher concentration regions.

21 Claims, 2 Drawing Sheets

NONVOLATILE MEMORY CELL WITH IMPROVED ISOLATION STRUCTURES

RELATED APPLICATION

This application is a division of co-pending U.S. application Ser. No. 14/501,666 entitled "NONVOLATILE MEMORY CELL WITH IMPROVED ISOLATION STRUCTURES" filed Sep. 30, 2014, which is hereby incorporated by reference herein in its entirety.

BACKGROUND

Non-volatile memory (NVM) devices are commonly used in the electronics world and provides computer memory that can retrieve stored information even when not powered. Non-volatile memory cells include floating gate transistors and in some cases, split-gate floating gate transistors. Non-volatile memory cells typically include an array of floating gate transistors and some adjacent floating gate transistors are isolated and separated from one another using thick oxide structures. The thick oxide structures include shallow trench isolation (STI) devices formed in trenches and filled with dielectric materials, and also thick field oxide, FOX, structures disposed between the transistors.

The STI or FOX structures used to separate and isolate adjacent floating gate transistors from one another generally include upper surfaces that extend above the substrate surface and which form sharp interfaces with the substrate surface. This topography can cause several problems including the undesirable retention of charge at undesired locations. The etching processes used to form trenches within which the STI structures are formed, create undesirable crystal defects in the sidewalls of the trenches. The STI or FOX structures have been found to be the source of stress defects, electrical defects and poor topography that causes degradation of NVM performance. It would be desirable to produce NVM cells without the above-identified problems.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure, in various embodiments, provides for an array of floating gate transistors of a non-volatile memory, NVM, cell. The floating gate transistors are separated from one another by high-concentration dopant impurity regions. The array is formed over a substrate portion that includes a continuous and planar upper surface. The continuous and planar upper surface is achievable because the high-concentration dopant impurity regions are formed in a P-field region and each extend downwardly from the continuous and planar upper surface of the substrate over which the array is formed. Shallow trench isolation (STI) and field oxide (FOX) isolation structures are not used in the array area and the disclosure provides the advantage that problems associated with the topography of STI and FOX isolation structures is avoided. The problems associated with the crystal defects formed the sidewalls of the trenches due to the etching processes used to form trenches for the STI structures, are also avoided. In some embodiments, the floating gate transistors are split-gate floating gate transistors in which the control gate or word line extends only partially over the subjacent floating gate. The smooth upper surfaces and lack of crystal defects associated with sidewalls, alleviates unwanted sharp edges on the substrate surface and enables the formation of structures over the substrate surface without sharp edges. The absence of sharp edges reduces power consumption of non-volatile memory, NVM cells, enhances the endurance of floating gate transistors, prolongs data retention of floating gate transistors, and improves the disturb characteristics of the floating gate transistors because the sharp edges are prone to high current concentrations. The use of an implant instead of deposited or grown oxide structures enables the size reduction of the unit cell size of an array of floating gate transistors that form an NVM cell because implantation regions can be made to smaller controlled dimensions than STI structures or grown oxides.

Figure 1A:
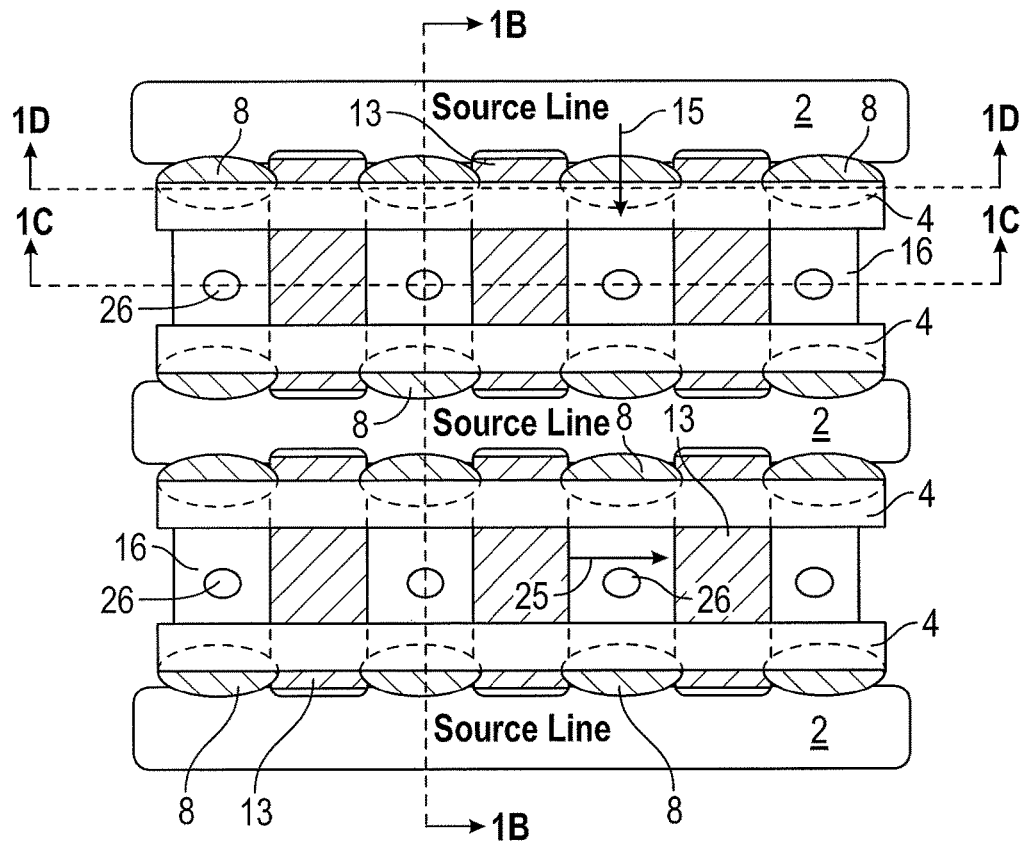
FIG. 1A is an illustration of a plan view of an array of split gate floating gate transistors of an NVM cell according to various embodiments of the disclosure.
Figure 1B:
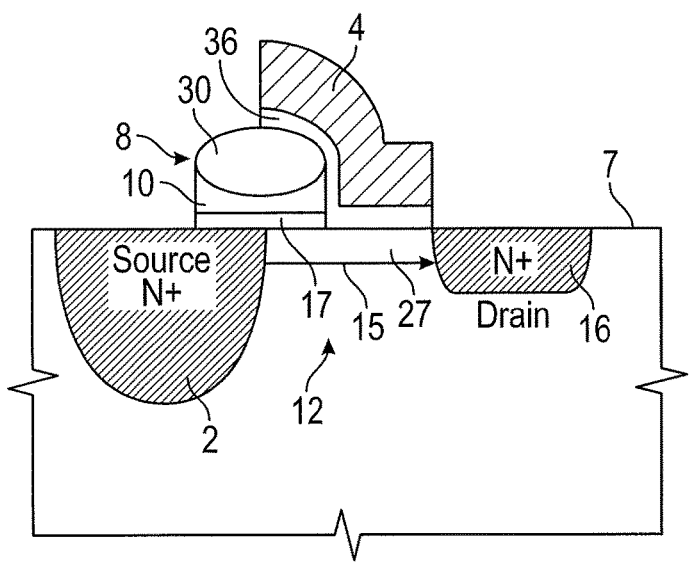
FIG. 1B is a cross-sectional view taken along line 1B-1B of FIG. 1A.
Figure 1C:
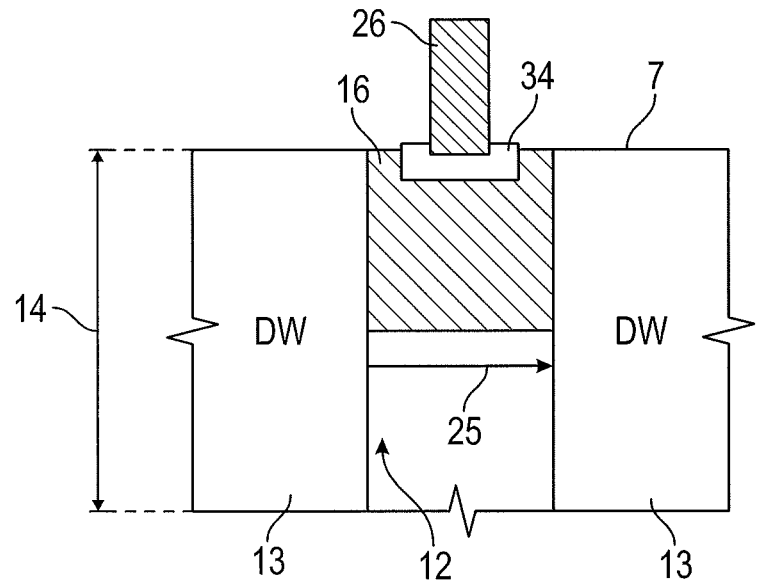
FIG. 1C is a cross-sectional view taken along line 1C-1C of FIG. 1A.
Figure 1D:
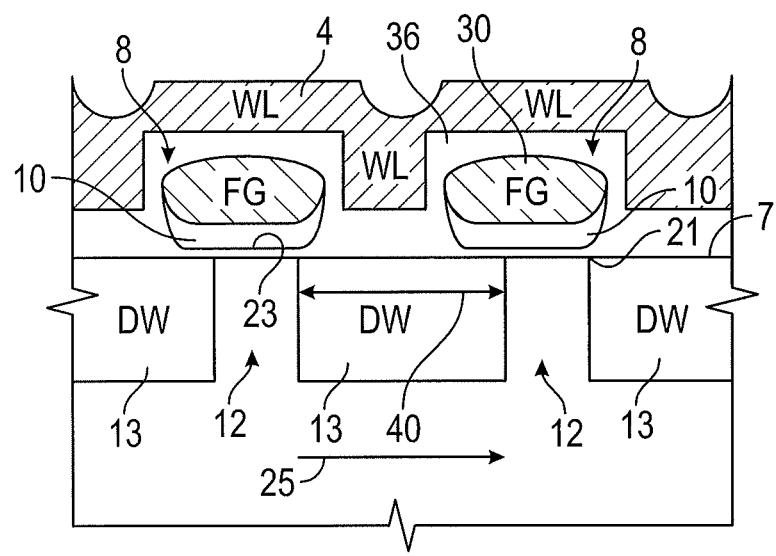
FIG. 1D is a cross-sectional view taken along line 1D-1D of FIG. 1A.

FIG. 1A is a plan view showing a portion of an array of floating gate transistors according to some embodiments of the disclosure. FIGS. 1B, 1C and 1D are each cross-sectional views taken along the indicated line shown in FIG. 1A. The following description refers to each of FIGS. 1A, 1B, 1C and 1D. The floating gate transistors of the array will be described in terms of N-type floating gate transistors, i.e., floating gate transistors with N-type source and drain regions formed over a P-type channel region. In various other embodiments, however, the non-volatile memory cell includes P-type floating gate transistors in which the dopant types are reversed with respect to the following description.

According to the N-type floating gate transistor embodiment, a P-field region is formed within the substrate. The substrate is a silicon or other suitable substrate used in the semiconductor manufacturing industry. P-field region 12 is shown most clearly in FIGS. 1B, 1C and 1D, but is essentially obscured in FIG. 1A. The array of floating gate transistors shown in FIG. 1A is formed over or on a P-field region of a substrate. P-field region 12 is formed by ion implantation or diffusion of impurities into the substrate, in various embodiments of the disclosure and may be formed of boron or other suitable P-type dopant impurities in various embodiments. In some embodiments, P-field region 12 includes a dopant concentration in the range of about 1e15 atoms/cm3 to about 5e17 atoms/cm$^3$ and has a dopant concentration of about 1e16 atoms/cm3 to 1e17 atoms/cm$^3$ in some embodiments. P-field region 12 has a dopant concentration of around 1e17 atoms/cm$^3$ in some embodiments, but other dopant impurity concentrations suitable for use as transistor channels, are used in other embodiments. The P-field region 12 includes various dimensions in various embodiments. The NVM array of FIG. 1A includes an array of floating gate transistors, associated with a corresponding floating gate structure 8 and although sixteen such structures are represented in FIG. 1A, the NVM arrays include various numbers of floating gate transistors in various embodiments.

Channel direction 15 is the direction along which current flows from source to drain in an operating floating gate transistor. Along the direction orthogonal to channel direction 15, i.e. along orthogonal direction 25, the respective transistors represented by the respective floating gate structures 8, are separated from one another by spaced apart high concentration dopant impurity regions 13. According to one description, along orthogonal direction 25 are alternating regions of P-field region 12 and high concentration dopant impurity regions 13. High concentration dopant impurity regions 13 are P+ regions within the P-field region 12 and include higher concentrations of the same dopant impurity species, than the P-field region 12. High concentration dopant impurity regions 13 are rectangular in shape in the plan view of FIG. 1A enabling the formation of an array of linearly arranged transistors, but take on other shapes in other embodiments. The rectangular shape includes a lesser lateral dimension of about 0.4 microns in some embodiments, as will be shown in FIG. 1D. High concentration dopant impurity regions 13 are formed by introducing dopant impurity species into already formed P-filed region 12 using ion implantation or diffusion or other suitable methods for introducing dopant impurities into a substrate material in some embodiments. In some embodiments, high concentration dopant impurity regions 13 include the same dopant species as P-field region 12 and in other embodiments, high concentration dopant impurity regions 13 and P-field regions 12 are formed of the same dopant impurity type (i.e. "N" or "P") but different dopant species.

Now referring to features most clearly shown in FIGS. 1A and 1B, source regions 2 are formed within P-field region 12 and take on the structure of source lines in the embodiment shown in FIG. 1A. Source regions 2 are N$^+$ regions and are formed by ion implantation or other suitable methods of introducing N-type dopant impurities such as phosphorus or other suitable N-type dopants, into P-field regions 12. N$^+$ drain regions 16 are also formed within P-field 12. N$^+$ drain regions 16 are formed by ion implantation or other suitable means for introducing dopant impurities into a substrate. The N$^+$ regions, i.e. source regions 2 and N$^+$ drain regions 16 are formed of phosphorus, arsenic or other suitable N-type dopant impurities in various embodiments. The N$^+$ regions, i.e. source regions 2 and N$^+$ drain regions 16, include various dopant concentrations in various embodiments, but the "N$^+$" designation is used in the semiconductor manufacturing industry to signify a relatively high dopant concentration compared to other N-type dopant concentrations. In some embodiments, either or both of the N$^+$ regions include phosphorus having a dopant concentration in the range of about 1e20 atoms/cm$^3$ to 1e21 atoms/cm$^3$ and in some embodiments, either or both of the N$^+$ regions include arsenic at a concentration in the range of about 1e20 atoms/cm$^3$ to 1e21 atoms/cm$^3$ but other N$^+$ dopant impurities and other concentrations sufficient for use as source/drain regions, are used in other embodiments.

FIG. 1B most clearly shows the P-field regions 12, source regions 2 and N$^+$ drain regions 16 are formed within and extend downwardly from substrate surface 7. P-field regions 12, source regions 2 and N$^+$ drain regions 16 do not extend above substrate surface 7. Substrate surface 7 is a continuous and planar surface throughout the array. Each floating gate transistor includes a floating gate structure 8 that includes floating gate electrode 10 and inter-gate oxide 30 formed over gate dielectric 17. Inter-gate oxide 30 is bi-convex in shape in FIG. 1B but has other configurations in other embodiments. Floating gate electrode 10 includes various dimensions in various embodiments and is formed of polysilicon in some embodiments and other suitable conductive or semiconductive gate materials in other embodiments. Word line 4 serves as a control gate that extends partially but not completely over floating gate structure 8 in the split-gate embodiment shown in FIG. 1B, but other arrangements are used in other embodiments. Word line 4 is formed of polysilicon or other suitable gate materials in various embodiments and is separated from floating gate structure 8 by dielectric liner 36 which is also an inter-gate dielectric. In some embodiments, word line 4 has a top surface that includes a silicide material. In addition to oxide, various other suitable dielectrics are used for dielectric liner 36 in various embodiments. Channel direction 15 is the direction along which charge flows between source regions 2 and N$^+$ drain structure 16. Channel direction 15 also indicates the channel, i.e., the uppermost portion of P-field 12 region between source regions 2 and N$^+$ drain regions 16 which provides the path along which charge flows between source regions 2 and N$^+$ drain structure 16.

The floating gate transistor structure 8 shown in FIG. 1B, is separated from further floating gate transistors that are adjacent floating gate transistor structure 8 along the direction in and out of the plane of the drawing FIGURE, i.e., adjacent along orthogonal direction 25 orthogonal to the channel direction. This is shown in FIG. 1A. In FIG. 1A, each floating gate transistor structure includes floating gate structure 8 which includes floating gate electrode 10 and inter-gate oxide 30. Channel direction 15 is shown in FIG. 1A which also shows that the floating gate structure 8 is partially overlapped by word line 4 that serves a control gate and the channel 27 includes charge moving from source regions 2 to N$^+$ drain regions 16 for the respective transistors.

Along the direction orthogonal to channel direction 15, i.e. along orthogonal direction 25, the respective transistors associated with respective floating gate structures 8, are separated from one another by high concentration dopant impurity regions 13. According to the N-type floating gate transistor embodiment, high concentration dopant impurity regions 13 are P$^+$ dopant impurity regions and in various embodiments, the high concentration dopant impurity regions 13 are deep P-well dopant impurity regions designated DW regions. In some embodiments, high concentration dopant impurity regions 13 are doped with boron and include a dopant impurity concentration greater than the dopant impurity concentration in P-field of region 12. In some embodiments, high concentration dopant impurity regions 13 are doped with boron and in some embodiments, high concentration dopant impurity regions 13 are doped at a concentration range of about 1e15-1e19 atoms/cm3 which provides a dopant concentration sufficient to isolate the devices formed in P-field regions 12 such as floating gate or other transistors formed between and isolated by the high concentration dopant impurity regions 13. The dopant concentration is also chosen to avoid breakdowns at any P-N junctions that may form between high concentration dopant impurity regions 13 and source regions 2 and N+ drain structure 16. Other dopant impurity species and other dopant impurity concentrations are used in other embodiments.

FIG. 1C shows high concentration dopant impurity regions 13 spaced apart along orthogonal direction 25 which is the direction orthogonal to channel direction 15. The floating gate transistor structures are formed in P-field regions 12 and between the respective high concentration dopant impurity regions 13. The current or charge that flows in channel direction 15 (see FIG. 1B), flows in the direction orthogonal to the plane of the drawing FIGURE for the drawing of FIG. 1C for the operating transistor. In FIG. 1C, N+ drain structure 16, to which the current of the floating gate transistors flows, is disposed above P-field region 12 in the area between high concentration dopant impurity regions 13. Contact 26 provides contact to N+ drain structure 16 and includes silicide region 34 formed on substrate surface 7 of N+ drain structure 16 in some embodiments. Still referring to FIG. 1C, high concentration dopant impurity regions 13 include depth 14 of about 1.5 microns or within the range of about 1-2 μm in some embodiments but other suitable depths that are deep enough to isolate P-field regions 12 from one another, are used in other embodiments.

FIG. 1D is also taken along orthogonal direction 25. FIG. 1D shows two floating gate structures 8, each including floating gate electrode 10 and inter-gate oxide 30 adjacent one another along the direction, orthogonal direction 25, orthogonal to a channel direction of the transistor. The adjacent transistors shown in FIG. 1D, are separated by high concentration dopant impurity region 13 and formed over P-field region 12. Word line 4 which serves as a control gate, couples the two adjacent transistors shown in FIG. 1D, but in other embodiments, other arrangements are used. Word line 4 is separated from the respective floating gate electrodes 10 by dielectric liners 36 and also inter-gate oxide 30. In some embodiments, high concentration dopant impurity regions 13 include a width 40 that ranges from about 0.2 to 0.6 microns and may be 0.4 microns, along orthogonal direction 25, but other widths are used in other embodiments. It is desirable to provide feature sizes as small as possible to increase integration levels and such widths are achievable using the patterning and implanting methods used to form dopant impurity regions 13. In some embodiments, the array includes features and spacings that are essentially the same throughout the array, for example, high concentration dopant impurity regions 13 include the same width and depth throughout the array but in other embodiments, the array may include different dimensions.

As shown in FIGS. 1B, 1C and 1D, substrate surface 7 is continuous and planar within the array region. For example, in FIG. 1D, the intersection 21 between high concentration dopant impurity regions 13 and P-field region 12 along surface 7 is smooth and there are no divots at intersection 21. This smooth surface enables floating gate electrode 10 to have smooth bottom edges 23, again free of divots or sharp points that cause the problems associated with high current concentration as described above. This, in turn, enables the formation of superjacent materials such as the word line, without sharp edges or divots. This alleviates any potential problems that could be caused by topography issues created by the use of STI or FOX structures instead of high concentration dopant impurity regions 13. STI and FOX structures are not present in the NVM array, in various embodiments.

The disclosed NVM cell structure provides for lower power consumption due to the absence of stress and divots at corners of STI structures as in other structures. Disturbed characteristics and data retention properties are improved and the avoidance of STI structures enables for greater integration levels as the high concentration dopant impurity regions 13 of the disclosed NVM can be formed to smaller dimensions than STI structures and avoid the crystal defects associated with forming the trenches used for the STI structures.

In various embodiments, a method for forming a non-volatile memory cell is provided. The method comprises: forming a field region with a first impurity type in a semiconductor substrate, the field region having a first impurity concentration; forming a plurality of spaced apart higher concentration regions with the first impurity type within the field region, the higher concentration regions each having a higher concentration than the first impurity concentration; and forming a plurality of floating gate transistors in the field region between the higher concentration regions.

In another embodiment, a method for forming a non-volatile memory cell is provided. The method comprises: providing a substrate region; forming spaced apart heavier doped impurity regions of a first impurity type in the substrate region; forming lesser doped impurity regions of the first impurity type in the substrate region; and forming a plurality of floating gate transistors in the lesser doped impurity regions.

Yet in another embodiment, a method for forming a non-volatile memory cell is provided. The method comprises: forming a P-field region in a semiconductor substrate, the P-field region having a first impurity concentration; forming a plurality of spaced apart higher concentration P+ regions within the P-field region, the higher concentration P+ regions each having a higher concentration than the first impurity concentration; and forming a plurality of floating gate transistors in the P-field region between the higher concentration P+ regions.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a non-volatile memory cell, comprising:
    forming a field region with a first impurity type in a semiconductor substrate, the field region having a first impurity concentration;
    forming a plurality of spaced apart higher concentration regions comprising the first impurity type within the field region, the higher concentration regions each having a higher concentration than the first impurity concentration; and
    forming a plurality of floating gate transistors in the field region between the higher concentration regions, wherein two respective adjacent ones of the plurality of floating gate transistors are isolated from each other by a respective one of the plurality of higher concentration regions, and wherein the non-volatile memory cell is free of shallow trench isolation (STI).

2. The method of claim 1, wherein the forming a plurality of floating gate transistors includes forming source/drain regions with a second impurity type, in the field region.

3. The method of claim 2, wherein the first impurity type comprises P-type and the second impurity type comprises N-type.

4. The method of claim 3, wherein the forming a plurality of spaced apart higher concentration regions within the field region comprises implantation of P-type dopant impurities into the field region at locations of the higher concentration regions and wherein the higher concentration regions comprise higher concentration P+ regions.

5. The method of claim 4, wherein the forming a plurality of floating gate transistors includes, for each floating gate transistor, forming a floating gate over the semiconductor substrate and forming a word line that extends partially but not completely over the floating gate transistor.

6. The method of claim 5, wherein the forming a plurality of floating gate transistors includes, for each floating gate transistor, forming source/drain regions comprising N+ regions in the field region, wherein a channel direction extends between the source/drain regions, and wherein the word line extends over the higher concentration P+ regions and couples floating gate transistors that are adjacent one another in a direction orthogonal to the channel direction.

7. The method of claim 6, wherein the higher concentration P+ region extends to a depth of about 1.5 microns and has a width of about 0.4 microns in the direction orthogonal to the channel direction.

8. The method of claim 1, wherein the two respective adjacent ones of the plurality of floating gate transistors are isolated from each other only by a respective one of the plurality of higher concentration regions.

9. A method for forming a non-volatile memory cell, comprising:
    providing a substrate region;
    forming spaced apart heavier doped impurity regions of a first impurity type in the substrate region;
    forming lesser doped impurity regions of the first impurity type in the substrate region; and
    forming a plurality of floating gate transistors in the lesser doped impurity regions, wherein two respective adjacent ones of the plurality of floating gate transistors are isolated from each other by a respective one of the heavier doped impurity regions, and wherein the non-volatile memory cell is free of shallow trench isolation (STI).

10. The method of claim 9, wherein the forming a plurality of floating gate transistors comprises forming the floating gate transistors adjacent one another in a direction orthogonal to respective channel directions of the floating gate transistors, and wherein the floating gate transistors are separated from one another by one of the heavier doped impurity regions, respectively.

11. The method of claim 10, wherein respective channel regions of the floating gate transistors are completely within the lesser doped impurity regions.

12. The method of claim 9, wherein the forming a plurality of floating gate transistors further comprises forming source/drain regions of a second impurity type bounding the channel regions and wherein the source/drain regions are disposed in the lesser doped impurity regions, respectively.

13. The method of claim 12, wherein the first impurity type comprises P-type and the second impurity type comprises N-type.

14. The method of claim 9, wherein the forming the heavier doped impurity regions and the forming the lesser doped impurity regions include forming the heavier doped impurity regions and the lesser doped impurity regions so that they extend downwardly from a planar and continuous upper surface of the substrate region.

15. The method of claim 9, wherein no oxide isolation structures are present in the substrate region.

16. A method for forming a non-volatile memory cell, comprising:
    forming a P-field region in a semiconductor substrate, the P-field region having a first impurity concentration;
    forming a plurality of spaced apart higher concentration P+ regions within the P-field region, the higher concentration P+ regions each having a higher concentration than the first impurity concentration; and
    forming a plurality of floating gate transistors in the P-field region between the higher concentration P+ regions, wherein two respective adjacent ones of the plurality of floating gate transistors are isolated from each other by a respective one of the plurality of higher concentration P+ regions, and wherein the non-volatile memory cell is free of shallow trench isolation (STI).

17. The method of claim 16, wherein the forming a plurality of floating gate transistors includes forming source/drain regions including N+ regions, in the P-field region.

18. The method of claim 16, wherein the forming a plurality of spaced apart higher concentration P+ regions within the P-field region comprises implantation of P-type dopant impurities into the P-field region at locations of the P+ regions.

19. The method of claim 16, wherein the forming a plurality of floating gate transistors includes, for each floating gate transistor, forming a floating gate over the semiconductor substrate and forming a word line that extends partially but not completely over the floating gate transistors.

20. The method of claim 19, wherein the forming a plurality of floating gate transistors includes, for each the floating gate transistor, forming source/drain regions comprising N+ regions in the P-field region, wherein a channel direction extends between the source/drain regions and wherein the word line extends over the higher concentration P+ regions and couples floating gate transistors that are adjacent one another in a direction orthogonal to the channel direction.

21. The method of claim 20, wherein the higher concentration P+ region extends to a depth of about 1.5 microns and has a width of about 0.4 microns in the direction orthogonal to the channel direction.

\* \* \* \* \*